United States Patent [19]
Zagar et al.

[11] Patent Number: 5,544,124
[45] Date of Patent: Aug. 6, 1996

[54] OPTIMIZATION CIRCUITRY AND CONTROL FOR A SYNCHRONOUS MEMORY DEVICE WITH PROGRAMMABLE LATENCY PERIOD

[75] Inventors: Paul S. Zagar; Scott Schaefer, both of Boise, Id.

[73] Assignee: Micron Technology, Inc., Boise, Id.

[21] Appl. No.: 403,382

[22] Filed: Mar. 13, 1995

[51] Int. Cl.⁶ ............................................. G11C 13/00
[52] U.S. Cl. ................... 365/230.08; 365/233; 365/194
[58] Field of Search .................................. 365/233, 194, 365/193, 230.08

[56] References Cited

U.S. PATENT DOCUMENTS

| | | | |
|---|---|---|---|
| 5,339,276 | 8/1994 | Takasugi | 365/233 |
| 5,402,388 | 3/1995 | Wojcicki et al. | 365/194 |

*Primary Examiner*—David C. Nelms
*Assistant Examiner*—Vu A. Le
*Attorney, Agent, or Firm*—Arnold, White & Durkee

[57] ABSTRACT

A method and apparatus for optimizing the speed path of a memory access operation in a synchronous depending upon the present latency period for the synchronous DRAM. The improved memory device compensates the time between row address latching and column address latching (tRCD) by delaying the presentment of the column address to compensate tRCD from the time available for column address latching to valid data-out (tAA) when tRCD is the critical parameter. Optimization circuitry reduces the amount of time available for tAA and "shifts" it to the more critical parameter tRCD, enabling the optimization or reduction of the time allocated for tRCD by compensating tRCD with the extra time available for tAA. Thus, the memory access optimization circuitry enables an optimization or reduction in the total memory access time by compensating the optimized tRCD with the extra time available for tAA.

10 Claims, 3 Drawing Sheets

OPTIMIZATION CIRCUITRY AND CONTROL FOR A SYNCHRONOUS MEMORY DEVICE WITH PROGRAMMABLE LATENCY PERIOD

FIELD OF THE INVENTION

The present invention relates generally to memory devices, such as DRAMs. More particularly, the present invention relates to optimization circuitry and control for Synchronous Memory Devices having programmable latency periods.

BACKGROUND OF THE INVENTION

Typical dynamic random access memories (DRAMs) are generally asynchronous devices whose operation are controlled in large part by the row access signals (RAS) and column address signals (CAS).

Synchronous dynamic random access memories (SDRAMs) are designed to operate in a synchronous memory system. As such, the input and output signals, with the possible exception of clock enable during Power Down and Self Refresh modes, are synchronized to the edge of the system clock. Synchronous DRAMs provide substantial advantages in dynamic memory operating performance. One key advancement of the synchronous DRAM is its ability to synchronously burst data at a high-speed data rate. Additionally, synchronous DRAMs come with programmable features, such as a programmable READ latency period. Programmable READ latencies of one, two or three clocks are typical. The READ latency determines at which clock cycle the data will be available after a READ Command is initiated, regardless of the clock rate (tCK). Depending on the frequency, data can be made available on the output at a point up to one clock cycle less than the READ latency. For example, a programmed READ latency of two clock cycles with a cycle period which is greater than the minimum access time from the READ Command (tAA) will provide data almost immediately after the first clock cycle, but the data will remain valid until after the second clock cycle because of the programmed READ latency of two clock cycles.

The programmable READ latency enables the synchronous DRAM to be efficiently utilized in different memory systems having different system clock frequencies. For example, if the synchronous DRAM has a minimum access time (tAA) of 37 ns and the system clock cycle, tCK, is 15 ns (66 Mhz), a READ latency of three clock cycles will provide the first valid data-out between the second clock cycle (30 ns) and the third clock cycle (45 ns) from the READ Command. The data remains valid until after the third clock cycle (the READ latency period). However, if the tCK for the memory system is 25 ns (40 Mhz), the programmer of the synchronous DRAM may find some time benefits in setting the READ latency to two. If the READ latency is set at two, the first valid data-out will occur between the first clock cycle (25 ns) and the second clock cycle (50 ns) from the READ Command. The data remains valid until after the second clock cycle (the READ latency period), but if the READ latency were programmed at three, the valid data-out would remain until after the third clock cycle (75 ns) which would be an inefficient use of time.

Standard synchronous DRAMs latch and decode the row address when Row Address Strobe is fired via an Active Command and then will latch and decode the column address when Column Address Strobe is fired via the READ/WRITE Command. The two critical parameters are tRCD (Active Command to READ/WRITE Command) and the tAA (READ/WRITE Command to data-out). Synchronous DRAMs utilizing a pipelined architecture have been used with tAA and tRCD to have similar performance. Depending on the system clock frequency, typical synchronous DRAMs allocate three system clock cycles each for tRCD and tAA. For a lower system clock frequency, tRCD and tAA can be set at two system clock cycles each. As such, the total memory access time is 6 clock cycles and 4 clock cycles, respectively. A need always exists for minimizing the time required for a memory access, and if either tRCD and tAA can be reduced without affecting system operation, the memory access time of the system can be reduced.

Accordingly, there is a need for a device for optimizing the speed path for DRAMs with programmable READ latencies which minimizes the time requirements for a memory access.

SUMMARY OF THE INVENTION

The present invention involves optimizing the speed path of a memory access operation in a synchronous memory with a programmable latency period. The optimization system accomplishes this by adjusting the time available for column address decoding to provide additional time for other time components or parameters of the memory access, such as the time required for row address latching and decoding, which are allocated less clock cycles as part of the optimization. Thus, the clock cycles required for a memory access can be optimized by reducing the clock cycles allocated to a time parameter and compensating the time parameter with excess time allocated to other time parameters.

Column address latching is usually fixed by system specifications, but clock latency is variable usually among one, two or three clock cycles. As such, the time for column address latching is not varied, but the time when column address decoding is enabled can be varied by optimization circuitry of the present invention to optimize the total memory access time. For example, when the number of clock cycles allocated for the time between the row address latching and the column address latching (tRCD) is reduced or optimized, tRCD becomes the critical time component or parameter. To enable this reduction, the optimization circuitry delays the decoding of the column address by delaying the presentation of the column address to the column decoder to provide additional time for the critical time parameter tRCD. The optimization circuitry effectively "shifts" the amount of time available for tAA (READ/WRITE Command to data-out) to the more critical component tRCD, enabling the optimization or reduction of the clock cycles allocated to tRCD. As such, the present invention enables an optimization or reduction in the total memory access time by internally providing tRCD, which has been allocated an optimized number of clock cycles, with the extra time available for tAA. Additionally, the time shift of the present invention can be made adjustable so as to match the process, the latency and the frequency of the system as well as accommodate future enhancements.

In accordance with a preferred embodiment of the present invention, if the time available for tRCD is reduced to two system clock cycles, and tAA is between two and three clock cycles (two clock cycles plus tKQ), the READ latency of the synchronous DRAM must be at least three system clock cycles to accommodate tAA. As such, if the READ latency is set at three clock cycles, tAA has extra time available, and tRCD, which has been optimized to two system clock cycles, is the yield limiting parameter. By delaying the decoding of the column address from when a READ/WRITE Command latches the column address, the optimization circuitry shifts the extra time available to tAA to the more critical component, tRCD. Thus, "phase shifting" the internal column address buffering from the external synchronous clock edge, which cannot be shifted, maximizes speed yield. Consequently, in this case, the present invention enables tRCD to be allocated only two system clock cycles because tRCD is compensated by the extra time available to tAA before the third system clock cycle, thereby optimizing the total time available for a memory access. In this case, the present invention enables the synchronous DRAM to perform a READ operation in five total system clock cycles rather than six.

BRIEF DESCRIPTION OF THE DRAWINGS

Other aspects and advantages of the present invention may become apparent upon reading the following detailed description and upon reference to the drawings in which.

Figure 1:
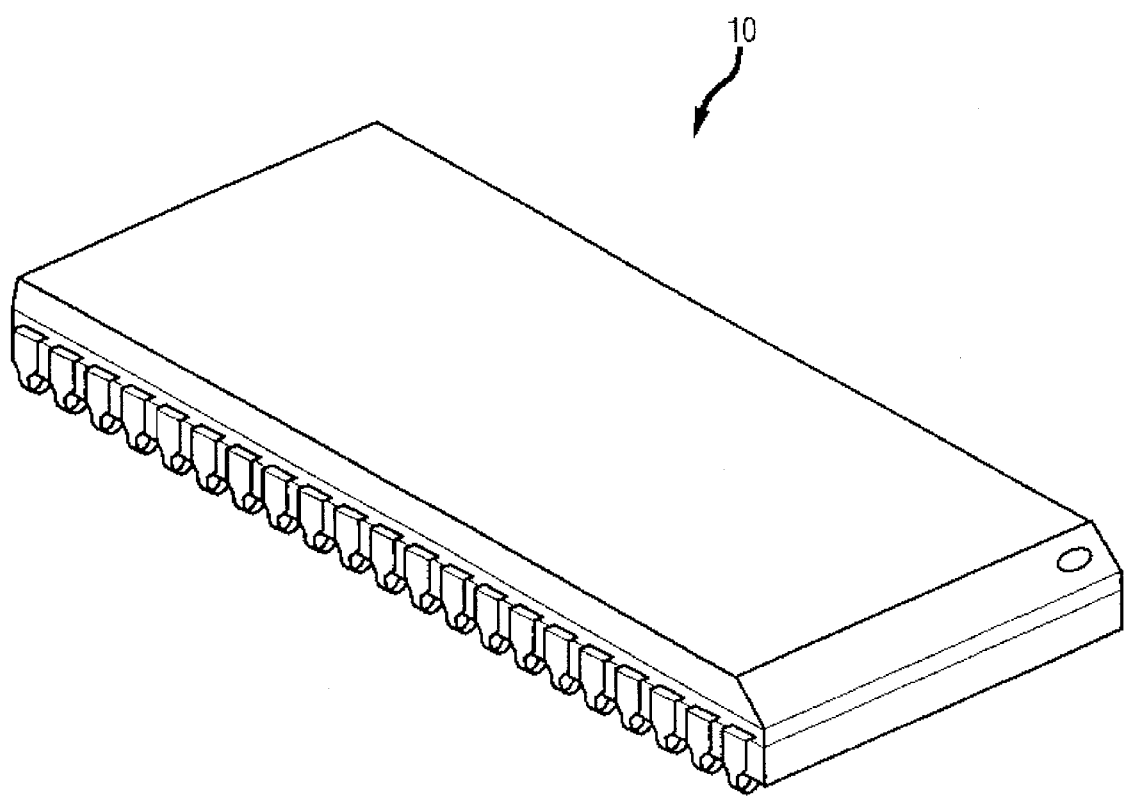
FIG. 1 is a perspective illustration of a semiconductor chip exemplifying a type of circuit device which may incorporate the principles of the present invention.

While the invention is susceptible to various modifications and alterative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION OF THE DRAWINGS

An illustrative embodiment of the optimization circuitry for a synchronous DRAM according to the principles of the present invention and methodology is described below as it might be implemented using the optimization circuitry to adjust the time between column address latching and the enabling of column address decoding to provide additional time for other time parameters of the memory access, such as the time required for row address latching and decoding, which are allocated less clock cycles as part of the optimization. In the interest of clarity, not all features of an actual implementation are described in this specification. It will of course be appreciated that in the development of any such actual implementation (as in any development project), numerous implementation-specific decisions must be made to achieve the developers' specific goals and subgoals, such as compliance with system- and business-related constraints, which will vary from one implementation to another. Moreover, it will be appreciated that such a development effort might be complex and time-consuming, but would nevertheless be a routine undertaking of device engineering for those of ordinary skill having the benefit of this disclosure.

The present invention has application in connection with synchronous DRAMs with programmable READ/WRITE latency periods which may be arranged in a conventional Small Outlying J-lead (SOJ), depicted as 10 in FIG. 1.

Figure 2:
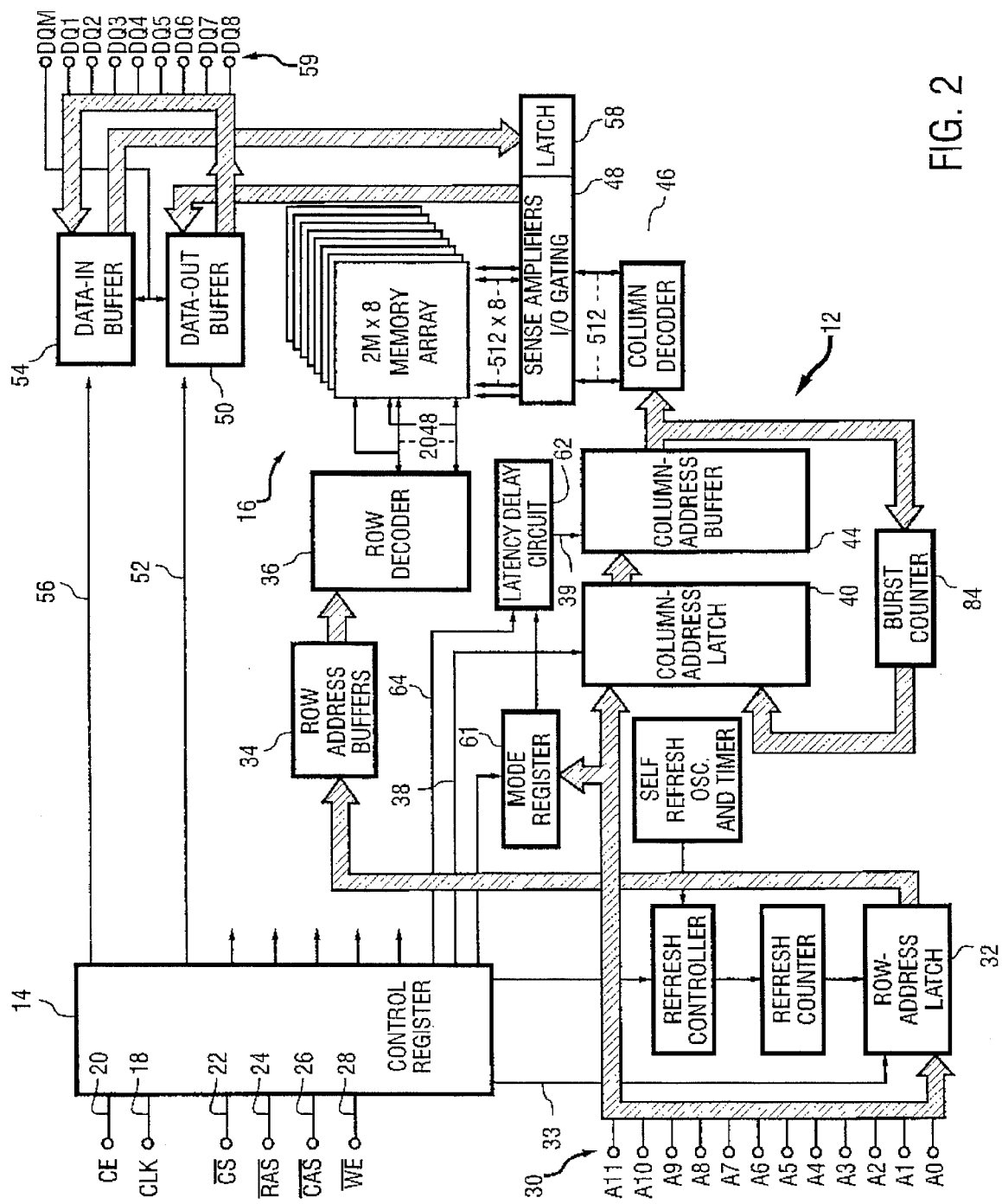
FIG. 2 is a block diagram of an exemplary arrangement and use of a Synchronous DRAM with a programmable READ latency period implementing optimization circuitry in accordance with the principles of the present invention.

FIG. 2 illustrates, in block diagram form, an exemplary arrangement and use of a synchronous DRAM 12 with a programmable READ latency cycle implemented in accordance with a preferred embodiment of the present invention. In this preferred embodiment, the synchronous DRAM can at least program the READ latency period to two and three system clock cycles.

The synchronous DRAM 12 includes a control register 14 that provides the synchronous interface and control logic for accessing a 2 Meg×8 memory array 16. The inputs to the control register include clock (CLK) 18, clock enable (CE) 20, chip select (CS) 22, Row-Address Strobe (RAS) 24, Column-Address Strobe (CAS) 26 and write enable (WE) 28. The CLK 18 is driven by the system clock, and, in the preferred embodiment, the synchronous DRAM's inputs are sampled on the positive edge of the CLK 18.

The significance of the remaining inputs and circuitry is known in the art, such as described in the Functional Specification for the MT48LC2M851 synchronous DRAM produced by Micron Semiconductor, Inc., Boise, Id. For discussion purposes, the RAS 24 (low) in conjunction with the WE 28 provide the Active Command. Address Inputs 30 (A0–A11) are latched in row address latch 32 by the Active Command as a row latching signal on line 33. The row address is passed to a row address buffer 34 and decoded by row decoder 36 to access the appropriate row in the memory array 16. The CAS 26 (low) in conjunction with the RAS 24 (low) and the WE 28 provide either the READ or WRITE Command. The READ/WRITE Command as the signal on line 38 latches the column address from the Address Inputs 30 (A0–A8) into a column address latch 40. The column address passes to column address buffer latch 44, and the column address latching signal on line 39 determines when the column address buffer latch 44 presents the column address to column address decoder 46. Latency delay circuit 62 delays the column address buffer latch 44 from producing the column address for column address decoding by adjusting the signal on line 64 to produce an adjusted column address latching signal on line 39. The column address is decoded by column decoder 46 to access the appropriate column of the memory array 16. Sense Amplifiers and I/O gating 48 enable the access to the appropriate byte of memory in the memory array 16. As is known by those skilled in the art, depending on whether a READ or WRITE Command is occurring, eight bits, i.e. one byte, is available to Data-Out buffer 50 and clocked in as determined by the timing signal on line 52, or the eight bits is written into the appropriate byte of the memory array after being stored in data-in buffer 54 as determined by the timing signal on line 56 and latch 58.

In accordance with the described embodiment, the parameter tRCD is measured from the Active Command to the READ/WRITE Command, and the parameter tAA is measured from the READ/WRITE Command to valid data-out. For discussion purposes, external tRCD is measured from the rising edge of the system clock upon the Active Command to the rising edge of the system clock upon the READ/WRITE Command, and external tAA is measured from the READ/WRITE Command to valid data-out.

Synchronous DRAMS typically utilize a pipelined architecture which demands that tAA and tRCD have similar performance. As such, a typical synchronous DRAM operating with a 75 Mhz system clock (tCK=13.3 ns) allocates three system clock cycles for both tRCD and tAA. Therefore, the system requires six system clock cycles to perform a READ operation. In such a case, tRCD is unnecessarily long, and if tRCD is reduced to two system clock cycles, the READ operation for the synchronous DRAM can be reduced by one system clock cycle. For example, a 75 Mhz system would allocate 26.6 ns (two system clock cycles) for tRCD and 35.6 ns for tAA (2 tCKs plus one interval access tKQ). Incidently, in this example, tAA is less than three system clock cycles because the data from the memory array is available on output terminals 59 after two tCKs and tKQ through the transparent data-out buffer 50. The time available between tAA and the third system clock cycle can be utilized to enable the reduction of tRCD because tRCD will be compensated by tAA. As such, if tRCD is only allocated two system clock cycles and tAA is allocated three system clock cycles, then tRCD becomes the yield limiting parameter. Consequently, the optimization circuitry shifts the extra time available to tAA to tRCD, resulting in an overall reduction in the total time for a memory access from six to five clock cycles with the read latency for the SDRAM set at 3 system clock cycles.

The synchronous DRAM of FIG. 2 can be operated at a variety of frequencies. At lower frequencies, it can be desirable to program the synchronous DRAM with a latency of two system clock cycles. With reference to FIG. 2, the synchronous DRAM 12 can include a mode register 61 which is programmed to set the latency time. As described above, when the READ latency time is set at three and the memory access time is less than three clock cycles, the extra time enables a reduction or optimization of tRCD to two clock cycles because a latency delay circuit 62 of the optimization circuitry compensates the yield limiting parameter, tRCD.

Figure 3A:
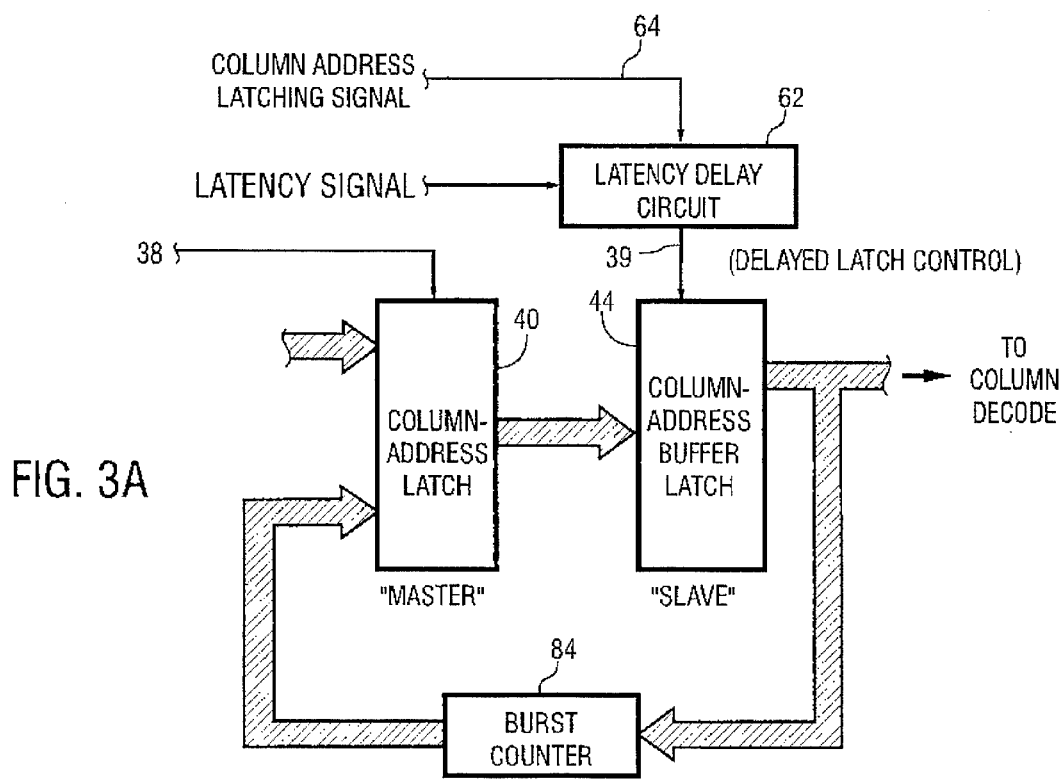
FIG. 3a shows a diagram including optimization circuitry in a portion of the SDRAM of FIG. 2 implemented in accordance with the principles of the present invention.

In accordance with the principles of the present invention and as can be best seen in FIG. 3a, the optimization circuitry includes the latency delay circuit 62 which controls the column address buffer latch 44 which is in a master-slave configuration with the master column address latch 40. The latency delay circuit 62 delays the decoding of the column address by delaying the presentation of the column address to the column address decoder 46 (FIG. 2) from the column address latch 40. The delay circuit 62 effectively compensates or provides additional time to the reduced tRCD from the extra time available for column address decoding. This will reduce the amount of performance time allocated for tAA and "shift" it to the more critical parameter tRCD.

In this particular embodiment, the column address latch 40 latches a new column address according to a signal on line 38. Once latched, the column address in column address latch 40 is valid, and the column address buffer latch 44 can be unlatched on the falling edge of the signal on line 39. Once unlatched, column address buffer latch 44 makes the column address from the column address latch 40 available to the column decoder 46 (FIG. 2). On the rising edge of the signal on line 39, the column address is latched on the column address buffer latch 44, and the column address latch 40 is ready to receive a new column address. Latency delay circuit 62 is used to delay the signal on line 64 to produce the signal on line 39 and thus delay when the column address on the column address latch 40 is presented to the column decoder 46 (FIG. 2). As discussed above, on the delay interval provides extra time for the optimized time component from the time available for column address decoding.

Figure 3B:
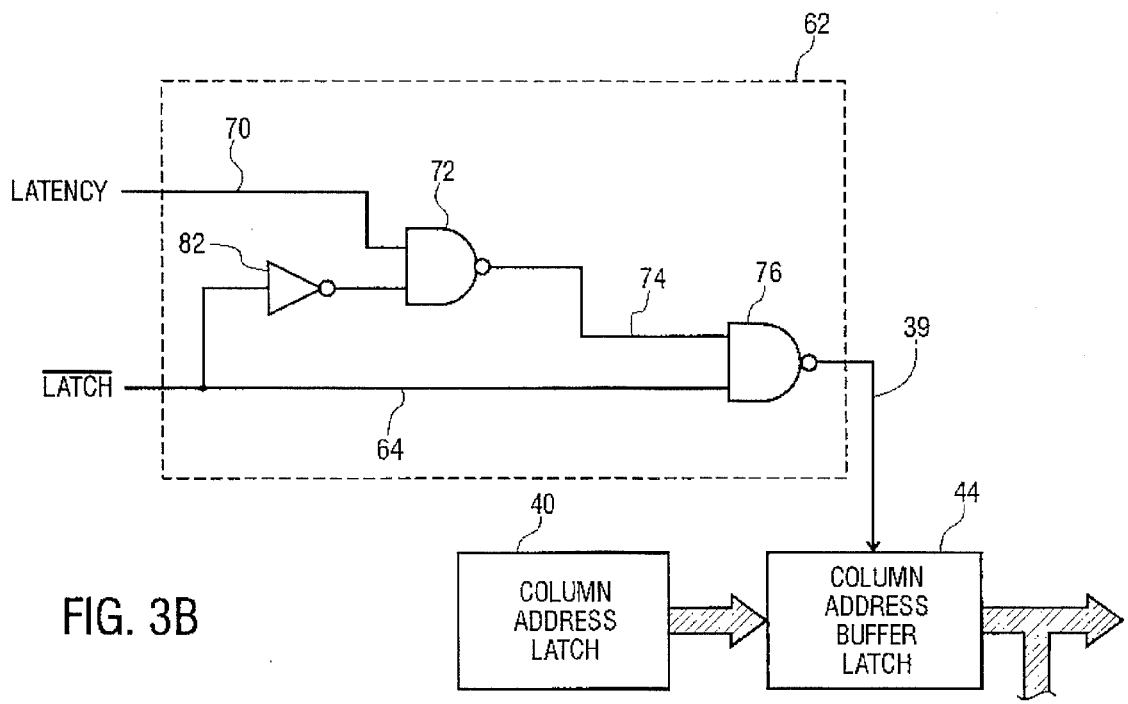
FIG. 3b shows a detailed diagram of a specific embodiment of a latency delay circuit of the optimization circuitry shown in FIG. 3a according to the principles of the present invention.

The latency delay circuit 62 can be implemented using the delay circuitry 62 shown in FIG. 3b. The delay circuitry 62 is responsive to a latency signal, which indicates the latency period of 3 system clock cycles in this embodiment. The predetermined latency signal indicates a latency period where the total memory access time is optimized by reducing the number of clock cycles allocated to a first time component and compensating the first time component with time available to a second time component which has extra available time. By receiving the latency signal, the delay circuitry 62 delays the inverse column latching signal on line 64 to produce the delayed column latching signal on line 39. The delayed signal on line 39 causes the column address buffer latch 44 to present the column address from the column address latch 40 to the column address decoder 46 (FIG. 2). As a result, column address decoding is delayed, and the delay effectively provides additional time for tRCD from the extra time available for column address decoding.

In the previous example, a 4.4 ns delay in presenting the column address for column address decoding will change the internal tRCD from 26.6 ns to 31 ns and reduce the internal tAA from 35.6 ns to 31 ns. Thus, "phase shifting" the internal column address buffering from the external synchronous clock edge (which cannot be shifted) by introducing a delay in the inverse column latching signal on line 64 will maximize speed yield because the requirement for tRCD is reduced by one clock cycle. Furthermore, the time delay can be made adjustable so as to match the process, the latency and the frequency of the system as well as accommodate future enhancements.

The implementation of the delay circuitry 62 receives the latency signal on line 70 from the mode register 61 (FIG. 2) and the inverse column address latching signal on line 64. The inverse column latching signal on line 64 is input into both NAND gate 76 and the inverting delay 82. In this particular embodiment, the column address buffer latch 44 is unlatched by the falling edge of the column latching signal on line 39. As such, the column address latched on the column address latch 40 is made available to the column decoder 46 (FIG. 2) through the column address buffer latch 44. In this particular embodiment, if the latency signal is low (latency is not set to optimizing latency period) on line 70, then the output of NAND gate 72 on line 74 is high, and the output of NAND gate 76 on line 39 reflects the inverse of the inverse column latching signal on line 64 without delay (assuming no delay in NAND gate 76). For example, if the inverse column latching signal on line 64 becomes high, then the column latching signal on line 39 becomes low, and the column address buffer latch 44 presents the column address latched on the column address latch 40 to the column decoder 46. As can be seen, no delay (ignoring the delay of NAND gate 76) is introduced into the inverted column latching signal on the line 64 when the latency signal on line 70 is low.

If the latency signal is high (latency is set to optimizing latency period of 3 clock cycles for this embodiment), the latency delay circuitry 62 is activated. As such, the latency delay circuit 62 delays the transition from low to high of the inverse column latching signal on line 64, thereby unlatching the column address buffer latch 44 with a transition from high to low on line 39. In this way, column address decoding is delayed to enable optimization of other time components of the total memory access time. The delay circuitry 62 provides a delayed column latching signal on line 39 which delays the unlatching of column address buffer latch 44 by delaying the transition of the signal on line 64 from driving the column latching signal on line 39 from high to low.

According to the specific circuitry of delay circuitry 62, the output of NAND gate 76 on line 39 becomes low after the signal on line 74 becomes high. The signal on line 74 becomes high only after the "high" inverse column latching signal on line 64 passes through inverting delay 82. The output of the inverting delay 82, which is now low, feeds into the NAND gate 72. The output of the NAND gate 72 becomes high on line 74 because the latency signal on line 70 is also high. As such, the transition from high to low of the column latching signal on the line 39 is delayed from the time of the low to high transition of the inverse column latching signal on line 64 due to the delay introduced by the inverting delay 82 and the NAND gate 72. Thus, the delayed column latching signal on line 39 delays column address decoding to compensate time-limited components of the total memory access time.

Using the previous example, the falling edge of the output of the NAND gate 76 is delayed by 4.4 ns from the rising edge of the inverse column latching signal on line 64. When the output of the NAND gate 76 falls, the column address buffer latch 44 makes the column address available for column address decoding.

The delay circuitry 62 of this particular embodiment delays the presentation of a column address for column address decoding, but the delay circuitry 62 does not delay the latching of the column address onto the column address buffer latch 44. For example, when the delay circuitry 62 is active and the inverse column latching signal on line 64 makes a transition from low to high, the output of the NAND gate 76 also makes a transition from low to high on line 39 but without a delay (assuming no delay for NAND gate 76) because a delay at this time is not advantageous for this specific embodiment. As previously discussed, when the column address buffer latch 44 latches the column address, the column address latch 40 can receive a new column address.

Thus, the present invention has been specifically described with a fixed latency delay circuit, but the present invention encompasses a programmable delay as part of the latency delay circuit for providing improved flexibility. Alternatively, other delay circuit configurations (not shown) could be used to delay column address decoding to provide additional time for the time-limited parameters of a memory cycle. For example, different logic circuits could be used with components having different specifications and functions. The optimization circuitry and control system of the present invention can be used to manipulate different time components for a memory access as well as with other latencies.

The principles of the present invention, which have been disclosed by way of the above examples and discussion, can be implemented using various circuit types and arrangements. The optimization circuitry and switches, for instance, can be implemented using a variety of logic components, delays or switches that enable the optimization of a memory access operation by compensating the optimized yet time-limited components with other time components having extra available time in the synchronous memory device. Furthermore, the present invention can be utilized with different signals, for a variety of memory access operations, and other latencies. The various signals used to enable and disable the operation of certain signals, of course, can be connected at different points along the signal paths. Those skilled in the art will readily recognize that these and various other modifications and changes may be made to the present invention without strictly following the exemplary application illustrated and described herein and without departing from the true spirit and scope of the present invention, which is set forth in the following claims.

We claim:

1. A memory device having a memory array of rows and columns of memory cells, said memory device operating in synchronization with a system clock, said device comprising:

a column address latch coupled to said address terminals and latching a column address;

an optimization circuit receiving a latency signal and a column latching signal, said optimization circuit adjusts said column latching signal to produce an adjusted column latching signal; and a column address buffer latch coupled to said column address latch, said column address buffer latch produces said column address for column address decoding in response to said adjusted column latching signal.

2. The memory device of claim 1 wherein said optimization circuit internally adjusts the phase difference between said column latching signal and said adjusted column latching by delaying said column latching signal by a predetermined amount.

3. The memory device of claim 1 further including memory access circuitry coupled to said memory array for accessing a portion of said memory array designated by said row address and said column address.

4. The memory device of claim 1 wherein said memory device is a synchronous dynamic random access memory.

5. A memory device having a memory array of rows and columns of memory cells, said memory device operating in synchronization with a system clock, said device comprising:

a row address latch coupled to address terminals and latching a row address upon receiving a row latching signal;

a column address latch coupled to said address terminals for latching a column address;

an optimization circuit receiving a latency signal and a column latching signal, said optimization circuit adjusts said column latching signal to produce an adjusted column latching signal;

a column address buffer latch coupled to said column address latch, said column address buffer latch produces said column address for column address decoding in response to said adjusted column latching signal; and memory access circuitry coupled to said memory array for accessing a portion of said memory array designated by said row address and said column address.

6. The memory device of claim 5 wherein said optimization circuit internally adjusts the time between said column address latching signal and column address decoding by delaying said column latching signal by a predetermined amount.

7. A method for optimizing memory access time in a memory device having a memory array of rows and columns of memory cells and operating in synchronization with a system clock, said method comprising the steps of:

providing said memory device with a latency period;

latching a column address;

providing a column latching signal;

adjusting said column latching signal if a latency signal indicates a predetermined latency period; and providing said column address for column address decoding in response to said adjusted column latching signal.

8. The method of claim 7 wherein said step of adjusting further includes delaying said column latching signal by a predetermined amount.

9. A synchronous dynamic random access memory having a memory array of rows and columns of memory cells, said memory comprising:

- a row address latch coupled to address terminals and latching a row address upon receiving a row latching signal;
- a column address latch coupled to said address terminals for latching a column address;
- a latency delay circuit receiving a latency signal and a column latching signal, said latency delay circuit delays said column latching signal to produce an adjusted column latching signal;
- a column address buffer latch coupled to said column address latch, said column address buffer latch produces said column address for column address decoding in response to said adjusted column latching signal; and
- memory access circuitry coupled to said memory array for accessing a portion of said memory array designated by said row address and said column address.

10. A method for optimizing memory access time in a random access memory device having a memory array of rows and columns of memory cells and operating in synchronization with a system clock, said method comprising the steps of:

- providing said memory device with a latency period;
- latching a column address;
- providing a column latching signal;
- delaying said column latching signal by a predetermined amount if a latency signal indicates a predetermined latency period; and
- providing said column address for column address decoding in response to said adjusted column latching signal.

* * * * *